United States Patent [19]
Brown

[11] Patent Number: 6,069,523
[45] Date of Patent: May 30, 2000

[54] DIFFERENTIAL DATA DRIVER

[75] Inventor: Anthony Kevin Dale Brown, Kanata, Canada

[73] Assignee: Nortel Networks Corporation, Montreal, Canada

[21] Appl. No.: 09/090,283

[22] Filed: Jun. 4, 1998

[51] Int. Cl.[7] .................................................. H03F 3/45
[52] U.S. Cl. ......................... 327/563; 327/67; 327/112; 326/89; 326/126; 330/260
[58] Field of Search ............................. 327/563, 65, 103, 327/362, 67, 108, 112; 326/89, 90, 126, 127; 330/260, 261, 255

[56] References Cited

U.S. PATENT DOCUMENTS

| | | | |
|---|---|---|---|
| 4,651,038 | 3/1987 | Cline et al. ............................. | 327/262 |
| 4,795,916 | 1/1989 | Liron ....................................... | 326/30 |
| 5,185,582 | 2/1993 | Barbu ...................................... | 330/261 |
| 5,382,838 | 1/1995 | Sasaki et al. ........................... | 327/108 |
| 5,418,492 | 5/1995 | Wang et al. ............................. | 330/260 |
| 5,530,444 | 6/1996 | Tice et al. ............................... | 330/252 |

*Primary Examiner*—Timothy P. Callahan
*Assistant Examiner*—Terry L. Englund
*Attorney, Agent, or Firm*—Angela C. de Wilton

[57] ABSTRACT

A digital data driver includes a differential amplifier having transistors which operate as a push-pull amplifier in class C mode. The transistors are conductive or non-conductive and controlled in response to a differential data input signal. The driver provides current to a load resistor of an external equipment and the direction of the current flowing therein is reversed in response to the input data. The differential amplifier transistors are connected to other transistors which provide source impedance to the external equipment. The source impedance of the driver is a controllable characteristic impedance of e.g., 50 Ω.

16 Claims, 1 Drawing Sheet

DIFFERENTIAL DATA DRIVER

TECHNICAL FIELD

The present invention relates to a differential data driver.

BACKGROUND INFORMATION

Modem high-speed digital system has as a key component a transceiver including interconnected driver and receiver. A driver with class AB output is disclosed in U.S. Pat. No. 5,382,838 granted to L. H. Sasaki et al on Jan. 17, 1998 and operates at a speed of 50 Mb/s. In today's communications technology, however, data buses with capacities of several Gb/s are frequently required. Efficient utilization of space on printed circuit cards necessitates the use of a minimum number of physical interconnections. Thus, for example, a 4 Gb/s data bus could be implemented as 8 parallel bit connections at 500 Mb/s each, or 16 parallel bit connections at 250 Mb/s each and so, for minimum interconnect space the 8-bit higher speed version would be preferred. Such interconnections are limited on the other hand to the maximum speed of the data drivers and receivers which must reliably handle the data. A third constraint, in addition to physical area and data speed, is due to power dissipation. It is not uncommon for many high speed buses to exist on a single printed circuit module and the power dissipated by the data drivers and receivers becomes an important consideration.

SUMMARY OF THE INVENTION

It is an object of the present invention to provide an improved differential data driver.

According to one aspect of the present invention, there is provided a differential data driver for providing a differential data output signal to external equipment including a resistive load element, in response to a differential data input signal, the driver comprising: differential inputs for receiving the input signal; differential outputs for connection to the load element of the external equipment; differential means for providing the output signal to the load element via the outputs, the differential means including first and second amplifier means and first current means, each amplifier means including a first transistor and impedance means, the collector of the first transistor being connected to the respective output and impedance means, the emitters of the first transistors of the first and second amplifier means being coupled and connected to the first current means; and driving means for enabling the differential means to provide the output signal to the load element in response to the input signal received by the differential inputs, so that the polarity of the output signal is controlled and current flows in the load element with respect to the polarity.

In the differential data driver, the differential data input signal is received and in response to the received input signal, the driving means enables the differential means including the first and second amplifier means to provide the differential data output signal to the resistive load element of the external equipment, the polarity of the output signal being controlled. Current flows in the load element with respect to the controlled polarity. The current flows through the first transistor and the impedance means of each of the first and second amplifier means. The source impedance of the driver to the external equipment depends upon the impedances of the first transistor and the impedance means. Thus, the source impedance of the driver is controllable.

For example, the driving means includes first and second response means for providing first and second drive signals of opposite polarities in response to the input signal. Each amplifier means operates in class C mode. The driving means further includes first and second push-pull drive means for driving the first and second amplifier means, each amplifier means being operative in a push or pull mode, in response to the respective drive signal, so that the differential means operates as a push-pull amplifier. Due to the push-pull amplifying operation, the driver achieves high speed differential data driving with high power efficiency and a relevant source impedance: e.g., 50-Ω characteristic impedance.

BRIEF DESCRIPTION OF THE DRAWINGS

Embodiments of the present invention will now be described by way of example with reference to the accompanying drawings in which.

DETAILED DESCRIPTION

Figure 1:
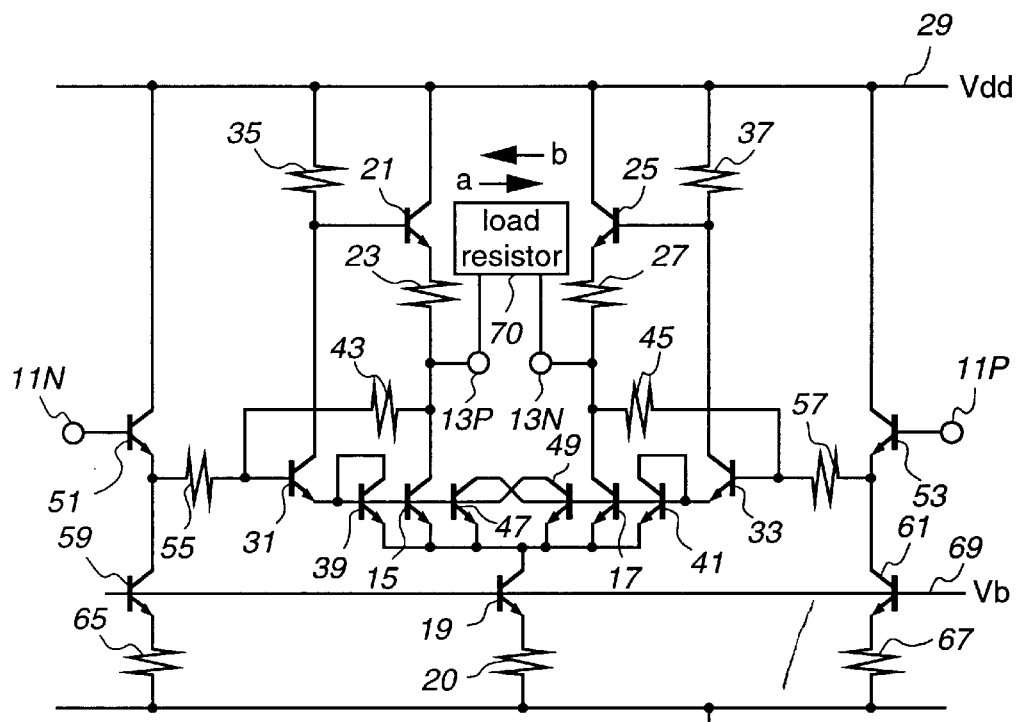
FIG. 1 illustrates a data driver according to one embodiment of the present invention.

FIG. 1 shows a differential data driver according to an embodiment of the present invention. The driver has negative, positive inputs 11N, 11P for receiving a differential data input signal and positive, negative outputs 13P, 13N for providing a differential data output signal. The driver includes a differential circuit having a pair of amplifier transistors 15, 17 and a current sink of series-connected transistor 19 and resistor 20. The emitters of the transistors 15, 17 are coupled and connected to the current sink. The positive and negative outputs 13P, 13N are connected to the collectors of the transistors 15, 17, respectively. The collector of the transistor 15 is connected to the emitter of a transistor 21 via a resistor 23. The collector of the transistor 17 is connected to the emitter of a transistor 25 via a resistor 27. Both of the transistor 21, resistor 23 and the transistor 25, resistor 27 are source impedance circuits for external receiving equipment (not shown). The collectors of the transistors 21, 25 are connected to a terminal 29 of supply voltage (e.g., 3.3 V). The driver further includes transistors 31, 33, the collectors of which are connected to the terminal 29 via resistors 35, 37 and to the bases of the transistors 21, 25. The emitters of the transistors 31, 33 are connected to the bases of diode-connected transistors 39, 41. A resistor 43 is connected between the collector of the transistor 15 and the base of the transistor 31. A resistor 45 is connected between the collector of the transistor 17 and the base of the transistor 33. The bases and collectors of transistors 47, 49 are cross-coupled. The emitters of the transistors 47, 49, 39, 41 are connected to the coupled emitters of the transistors 15, 17. The bases of the transistors 39, 15, 47 are coupled together and the bases of the transistors 49, 17, 41 are coupled together.

The driver includes circuitry for driving the differential circuit in response to the input signal, the circuitry including transistors 51, 53 responsive to the input signal fed to the bases thereof. The inputs 11N, 11P are connected to the bases of the transistors 51, 53, the collectors of which are connected to the terminal 29. The emitters of the transistors 51, 53 are connected to the bases of the transistors 31, 33 via resistors 55, 57 and to respective current sinks, each including series-connected transistor and resistor. The emitters of the transistors 51, 53 are connected to the collectors of transistors 59, 61, the emitters of which are connected to the ground terminal via resistors 65, 67. The bases of the transistors 19, 59, 61 are connected to a terminal 69 of bias voltage Vb, so that currents sunk by the current sinks are controlled by the voltage Vb.

The differential data input signal, which is fed to the inputs 11P, 11N, is typical of standard CML (current mode logic) (i.e., a swing of 200 mV below the positive power supply). The driver is connected to corresponding receiving equipment (not shown) which is typically a standard PECL CMOS receiver having a load resistor 70 (e.g., 100 Ω) at its inputs. The load resistor 70 is connected between the outputs 13P, 13N of the driver. The driver and the receiving equipment are completely dc isolated. The output voltage of the driver is a differential 800 mV swing at a mean dc level of about 2 volts, with supply voltage Vdd of 3.3 V.

The positive and negative outputs 13P and 13N are push-pull in nature, always providing a 50-Ω source impedance to the external connections whether the output is pulling high or low. For example, if the output 13P is pulling high (while the corresponding output 13N is pulling low), the 50-Ω source impedance at the output 13P is provided by the series connection of the resistor 23 and the emitter impedance of the transistor 21.

Alternatively, if the output 13P is pulling low (while the corresponding output 13N is pulling high), the 50-Ω source impedance at the output 13P is provided by the negative feedback loop comprising the resistors 43 and 55, and the transistors 31, 39 and 15. An identical circuit creates the 50-Ω source impedances at the output 13N when it is pulling low or high.

The differential circuit of the driver operates in class C mode, so that the entire current of the output transistors 21, 25, 15 and 17 is conducted through the load resistor 70. Therefore, to obtain an 800 mV differential signal across the load resistor 70 of 100 Ω, it is only necessary to provide a switched current of 4 mA in the transistors 21, 25, 15 and 17. In the process of switching the output polarity, the current direction in the load resistor 70 is reversed from direction a to b or vice versa. Thus, effectively switching a differential current of 8 mA in the load resistor 70, while only providing a dc source of 4 mA. Additional dc current is required in the associated support circuitry.

The operation of the driver will now be described in more detail with respect to FIG. 1. The transistors 59, 19, 61, in conjunction with associated emitter degeneration resistors 65, 20, 67 provide a regulated current sink to the driver circuit by means of the application of the bias voltage Vb to the terminal 69. The transistors 51 and 53 operate as emitter followers and are provided with bias current by the transistors 59, 61, respectively. For example, the transistors 51, 53 are biased with 0.5 mA current, so that their emitter output impedance is approximately the reciprocal of their transconductance, which in this case is about 50 Ω.

In the event that input 11N is pulled high while input 11P is pulled low, the transistor 51 provides drive current into the transistor 31 through the resistor 55, so that the transistor 31 sources current into the base of the transistor 15. This causes the transistor 31 to be turned on, thus causing current to flow through the resistor 35 and pulling the base of transistor 21 low. Typically, the switched current in the resistor 35 is 1.0 mA and the value of the resistor 35 (and the resistor 37) is 450 Ω. The same current will be mirrored by the transistor 39, so that a corresponding current flows in the transistor 15. In a typical arrangement, the ratio of the emitter sizes of the transistors 39 and 15 is 1:4, so that their corresponding emitter currents are in the same ratio.

The cross-coupled transistors 47 and 49 enhance the switching speed of the output circuit by means of positive feedback. When input 11N is pulled high, the transistor 47 is on and pulls the base of the transistors 49, 17, 41 low. In this mode, the transistor 47 is prevented from saturating by the series connection of the transistor 33, the resistor 57 and the transistor 53. While the inputs 11N, 11P are pulled high, low, no current flows in the transistors 41 and 17. Thus, apart from the small current in transistors 47 and 49, all the current regulated by the transistor 19 is switched either through the transistors 39, 15 or through the transistors 41, 17. Thus, the exact current flowing in either transistor 15 or 17 is known.

For example, if it is a design requirement that the current in the load resistor 70 should be 4 mA, then with the ratio of the mirrors of the transistors 39, 15 and of the transistors 41, 17 equal to 1:4, the required tail current provided by the transistor 19 is 5 mA. Since the total current of the driver is 6 mA, the driver provides 66 percent of its total current to the load resistor 70, and by reverse switching of this current in the load resistor 70, the driver is thus highly efficient. Also, note that the switched current in the transistor 31 or 33 would in this case be 1 mA, and a suitable value of 450 Ω for the resistors 35, 37 avoids saturating the transistors 15 or 17 while providing full voltage swing at the output.

While the input 11N is pulled high (and the corresponding input 13P is pulled low), the output 11P provides a 50-Ω source impedance as follows. In the example provided, the resistors 43 and 55 are required to provide feedback to the base of the transistor 31 with an attenuation of 8:1. For example, a suitable value for the resistor 43 is 2000 Ω, so that its current draw is small. To provide an 8:1 attenuation, the resistor 55 together with the series input impedance of the transistor 51 emitter (50 Ω in the example) must total 250 Ω. Therefore, a suitable value for the resistor 55 is 200 Ω. Suppose that a positive external switching transient caused by an improperly terminated load, should be present at the output 13P, the result will be a small attenuated voltage rise at the base of the transistor 31. This will cause the emitter of the transistor 31 to rise and attempt to raise the current in the transistors 39, 15. To provide this current, a small reservoir capacitor may be required between the collector of the transistor 19 and ground to augment the existing parasitic capacitance. As a result of the increased current in the transistor 15, an impedance will be seen at the collector of the transistor 15 of about 50 Ω. It will be appreciated that transients of both positive and negative polarities are properly terminated with 50 Ω by this circuit.

Stability considerations for the differential feedback loops require a dominant pole in each loop. The pole presented by the feedback loops at the inputs of the transistors 31, 33 are determined primarily by the input capacitance of the base connection of these transistors and the external resistive network and would be typically about 8 GHz. The dominant pole however occurs at the driver output and would typically be at about 1.5 GHz. This separation of the two pole frequencies gives adequate phase margin for the loop.

All of the foregoing remarks apply to the other input 11P and output 13N by symmetry.

A formal derivation of the pull-down output impedance is as follows:

The output admittance Gop of the amplifier at 13P comprising 31, 39 and 15 is derived from the diode equation thus:

$$G_{op} = \frac{\partial I_{15}}{\frac{kT}{q} \times \partial \ln(I_{15})} \times \frac{R_{55} + \frac{kT}{q} \times \frac{\partial \ln(I_{51})}{\partial I_{51}}}{R_{43}}$$

k: Boltzmann's constant

T: the absolute temperature q: the electron charge $I_{15}$: the current flowing in the collector of the transistor 15

$I_{51}$: the current flowing in the collector of the transistor 51

$R_{55}$: the resistance of the resistor 55

$R_{43}$: the resistance of the resistor 43

For the specific values of current and resistance given the output impedance is 50 Ω at room temperature. However, there is some variation due to temperature and several possible modifications of the circuit can reduce this temperature dependence. The following examples illustrate these options:

1. For example, suppose the current in the transistor 51 is reduced to 0.1 mA, the emitter output impedance rises and the value of the resistor 55 drops to zero. As a result, the temperature dependent terms of Equation 1 cancel. The temperature dependence of the pull-down output impedance now is solely dependent upon the temperature coefficient of the resistor 43 and that of the current sunk from the transistor 19. If a bandgap circuit is employed to create a current in the transistor 19 which is proportional to the temperature coefficient of the resistor 43 (standard practice in integrated circuit design) the temperature coefficient of the pull-down output impedance can be made close to that of the bandgap circuit itself, typically within +/−2% over the range 0 to 100° C. It is important to note that in this modified arrangement, the current in the transistor 51 or 53 is of the same order of magnitude as that in the resistor 43 or 45 when the outputs 11P, 11N are pulled-down, respectively. It is necessary to reduce the current sunk by the transistors 59 and 61 in order to achieve the desired current level in the transistor 51 or 53.

2. An alternative approach to reducing the temperature dependence of the pull-down output impedance is to use PTAT (proportional to absolute temperature) current sinks through transistors 59, 19, 61. Excellent output impedance stability is obtained, at the expense of a somewhat temperature dependent output drive level (28% over the range 0–100° C.), which however may be quite acceptable.

3. Without resorting to the modifications of examples 1 and 2 above, the temperature dependence of the output impedance can be calculated as follows. A typical precision integrated circuit polysilicon resistor can have a temperature coefficient of about −400 ppm/° C. In the pull-down mode of output 13P, the resistor 43 draws 0.2 mA from the emitter of the transistor 51, so that 0.3 mA is required from the transistor 59 to total 0.5 mA at the emitter of the transistor 51. Assuming all the resistors of the driver have the same temperature coefficient, the net temperature coefficient of the output impedance becomes −1900 ppm/° C., corresponding to a 19 percent change over 100° C. temperature variation. Optimized for a nominal 50° C. temperature, the pull-down output impedance of 50 Ω can be held within +/−20% due to process and +/−10% due to temperature over the range 0–100° C. This yields a minimum return loss of 15 dB, which is a significant improvement over the unterminated case.

The pull-up output impedance at the output 13P is derived as follows. In the example, a typical pull-down current at the output 13P or 13N is about 4 mA. Since all this current flows through the load resistor 70, it is dissipated in the corresponding pull-up transistor, 25 or 21. As a result we can derive the emitter impedance seen at the transistor 25 or 21 as the reciprocal of the transconductance and at room temperature this is 6.2 Ω. (In this calculation, small parasitic emitter resistance is neglected since the output transistors are normally quite large). To obtain a 50-Ω pull-up impedance at the output 13P, the resistor 23 must be about 44 Ω. The emitter impedance of the transistor 25 or 21 is proportional to absolute temperature as before, but since the absolute value is so small, the variation over normal working conditions is only about 2 Ω and may be neglected. The pull-up output impedance seen at the output 13P is therefore primarily dependent upon the resistor 23.

The foregoing derivation of the pull-up output impedance seen at the output 13P also applies to the output 13N, by symmetry.

The data format provided by the driver is described as pseudo positive emitter coupled logic (PPECL).

Figure 2:
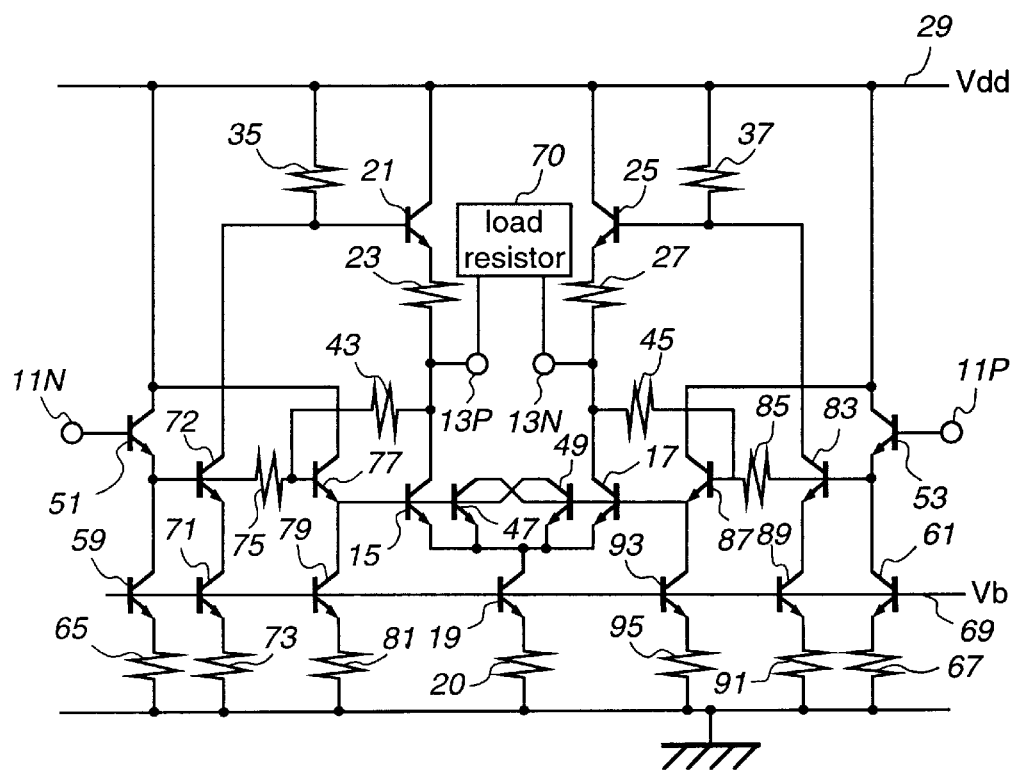
FIG. 2 illustrates a model of a data driver according to another embodiment of the present invention.

FIG. 2 shows another embodiment which is a modification of the circuit shown in FIG. 1. The ratioed current mirrors of the transistors 39, 15 and 41, 17 of the driver shown in FIG. 1 are replaced by appropriately ratioed current sink mirrors of the driver shown in FIG. 2. In FIG. 2, the emitter of the transistor 51 is directly connected to the base of the transistor 72, the emitter of which is connected to a current source of a transistor 71 and a resistor 73. The emitter of the transistor 51 is connected via a resistor 75 to the base of a transistor 77, the emitter of which is connected to a current source of a transistor 79 and a resistor 81. The feedback resistor 43 is connected to the base of the transistor 77, the collector of which is connected to the terminal 29 of the voltage Vdd. The resistors 23, 43 are connected in series. Similarly, the emitter of the transistor 53 is connected directly to the base of a transistor 83 and via a resistor 85 to the base of a transistor 87. The emitter of the transistor 83 is connected to a current source of a transistor 89 and a resistor 91. The emitter of the transistor 87 is connected to a current source of a transistor 93 and a resistor 95. The collector of the transistor 87 is connected to the terminal 29. The feedback resistor 45 is connected to the base of the transistor 87. The resistors 27, 45 are connected in series.

In the driver of FIG. 2, the current sinks wherein sink currents are controlled by the bias voltage Vb are appropriately ratioed current sink mirrors. The operation of the driver of FIG. 2 is similar to that of the driver of FIG. 1. The driver operates in class C mode and its differential circuits including the amplifier transistors 15, 17 operate as push-pull amplifier. Source impedance of 50 Ω is provided by the series connection of the resistor 23 (or 27) and the emitter impedance of the transistor 21 (or 25) to the external receiver equipment connected to the outputs 13P, 13N.

Although particular embodiments of the present invention have been described in detail, it should be appreciated that numerous variations, modifications, and adaptations may be made without departing from the scope of the present invention as defined in the claims. For example, the types of the bipolar transistors may inverse.

What is claimed is:

1. A differential data driver for providing a differential data output signal to external equipment including a resistive load element, in response to a differential data input signal, the driver comprising:

differential inputs for receiving the input signal;

differential outputs for connection to the load element of the external equipment;

differential means for providing the output signal to the load element via the outputs, the differential means including first and second amplifier means and first current means, each of the first and second amplifier means operating in class C mode, each of the first and second amplifier means including a first transistor and impedance means, the collector of the first transistor being connected to the respective output and impedance means, each of the impedance means comprising a resistive circuit, each of the resistive circuits comprising a second transistor and a first resistive element connected to the emitter of the respective second transistor, the emitters of the first transistors of the first and second amplifier means being coupled and connected to the first current means;

driving means for enabling the differential means to provide the output signal to the load element in response to the input signal received by the differential inputs, so that the polarity of the output signal is controlled and current flows in the load element with respect to the polarity, the driving means comprising first and second response means for providing first and second drive signals of opposite polarities in response to the input signal, the driving means further comprising first and second push-pull drive means for driving the first and second amplifier means, each of the amplifier means being operative in a push or pull mode, in response to the respective drive signal, so that the differential means operates as a push-pull amplifier, each of the push-pull drive means comprising a third transistor and a second resistive element connected to the collector of the respective third transistor, the junction of each of the second resistive elements and the collector of the respective third transistor being connected to the base of the respective second transistor; and first and second feedback means for providing negative feedback signals from the differential means to the respective push-pull drive means.

2. The driver of claim 1, wherein each of the feedback means comprises a third resistive element connected between the respective output and the base of the respective third transistor, the respective third and first resistive elements being connected in series.

3. The driver of claim 2, wherein each of the response means comprises coupling means for feeding the respective drive signal directly or indirectly therefrom to the base of the respective third transistor.

4. The driver of claim 3, wherein each of the coupling means comprises a fourth resistive element coupled to the base of the respective third transistor.

5. The driver of claim 1, wherein each of the amplifier means further comprises a fourth transistor, the respective fourth and first transistors forming a current mirror circuit, the current mirror ratio of which is predetermined to control the current of the push-pull amplifier output.

6. The driver of claim 5, wherein each of the fourth transistors is a diode-connected transistor, the base of each of the fourth transistors being connected to the emitter of the respective third transistor, the emitter of each of the fourth transistors being connected to the coupled emitters of the first transistors of the first and second amplifier means.

7. The driver of claim 6, wherein the differential means further comprises fifth and sixth transistors, the base and collector of the fifth transistor being connected to the collector and base of the sixth transistor, respectively, the bases of the fifth and sixth transistors being connected to the bases of the respective first transistors of the first and second amplifier means, the emitters of the fifth and sixth transistors being connected to the coupled emitters of the first transistors of the first and second amplifier means.

8. The driver of claim 1, wherein each of the response means comprises an emitter follower circuit for providing the respective drive signal.

9. The driver of claim 8, wherein each of the emitter follower circuits comprises a fourth transistor and second current means connected to the emitter of the respective fourth transistor.

10. The driver of claim 9 wherein the first current means and each of the second current means of the emitter followers comprises series-connected transistor and resistive element.

11. The driver of claim 10, wherein each of the transistors of the first and second current means is a proportional to absolute temperature device, the bases of the transistors being coupled, so that bias voltage controls sink currents flowing in each of the transistors of the respective current means.

12. The driver of claim 1, wherein each of the push-pull drive means further comprises a fourth transistor and a second current means, the emitter of each of the fourth transistors being connected to the base of the respective first transistor and the respective second current means, each of the feedback means comprising a third resistive element connected between the respective output and the base of the respective fourth transistor, the respective third and first resistive elements being connected in series.

13. The driver of claim 12, further comprising two coupling means, each of the two coupling means feeding the drive signal directly or indirectly from the respective response means to the base of the respective fourth transistor.

14. The driver of claim 13, wherein each of the two coupling means comprises a fourth resistive element coupled to the base of the respective fourth transistor.

15. The driver of claim 14, wherein each of the push-pull drive means further comprises a third current means connected to the emitter of the respective third transistor, the base of each of the third transistors being directly connected to the respective response means.

16. The driver of claim 15, wherein each of the response means comprises fourth current means, each of the first and the respective second, third and fourth current means comprising series-connected transistor and resistive element, the bases of the transistors of the first and the respective second, third and fourth current means being coupled, so that bias voltage controls sink currents flowing in their respective transistors.

* * * * *